US012707922B2

(12) United States Patent
Kode

(10) Patent No.: US 12,707,922 B2
(45) Date of Patent: Aug. 11, 2026

(54) DETERMINING A SUBSTRATE LOCATION THRESHOLD BASED ON OPTICAL PROPERTIES

(71) Applicant: APPLIED MATERIALS, INC., Santa Clara, CA (US)

(72) Inventor: Venkata Raghavaiah Chowdhary Kode, Pflugerville, TX (US)

(73) Assignee: Applied Materials, Inc., Santa Clara, CA (US)

(*) Notice: Subject to any disclaimer, the term of this patent is extended or adjusted under 35 U.S.C. 154(b) by 685 days.

(21) Appl. No.: 17/991,039

(22) Filed: Nov. 21, 2022

(65) Prior Publication Data

US 2024/0170312 A1 May 23, 2024

(51) Int. Cl.
*H10P 72/00* (2026.01)
*H10P 72/50* (2026.01)
*H10P 74/20* (2026.01)

(52) U.S. Cl.
CPC .......... *H10P 72/0606* (2026.01); *H10P 72/53* (2026.01); *H10P 74/203* (2026.01)

(58) Field of Classification Search
CPC . H01L 21/67259; H01L 21/681; H01L 22/12; H01L 21/67742; H01L 21/67766
See application file for complete search history.

(56) References Cited

U.S. PATENT DOCUMENTS

2012/0253511 A1 10/2012 Saeki et al.
2013/0194574 A1* 8/2013 Katsuda ................ H01L 21/681 356/400
2016/0158935 A1* 6/2016 Inomata ................. B25J 9/0081 700/214
2017/0173797 A1* 6/2017 Inomata ................. B25J 9/0081
2019/0073566 A1 3/2019 Brauer
2020/0196389 A1 6/2020 Ueno et al.
2020/0411348 A1* 12/2020 Yoshida ............ H01L 21/67778
(Continued)

FOREIGN PATENT DOCUMENTS

CN 101404263 B * 5/2013 .......... B25J 11/0095
JP 2009543355 A 12/2009
JP 2011181721 A 9/2011
(Continued)

OTHER PUBLICATIONS

International Search Report and Written Opinion for International Application No. PCT/US2023/080471, mailed Mar. 26, 2024, 09 Pages.

*Primary Examiner* — Mohammed Shamsuzzaman
(74) *Attorney, Agent, or Firm* — Lowenstein Sandler LLP

(57) ABSTRACT

A system includes an optical sensor including an emitting element and a receiving element. The optical sensor is configured to detect an optical transmission ratio of a substrate responsive to a substrate support supporting the substrate in an optical path of the first optical sensor. The system further includes a processing device communicatively coupled to the optical sensor. The processing device is configured to determine an optical threshold based on the optical transmission ratio of the substrate. The processing device is further configured to determine a location of the substrate relative to a substrate-handling robot end effector based on sensor data output by a location sensor and the optical threshold.

13 Claims, 10 Drawing Sheets

(56) References Cited

U.S. PATENT DOCUMENTS

| | | | | |
|---|---|---|---|---|
| 2021/0291375 | A1* | 9/2021 | Bergantz | H01L 21/67742 |

FOREIGN PATENT DOCUMENTS

| | | | | | |
|---|---|---|---|---|---|
| JP | 2012059951 | A | | 3/2012 | |
| JP | 5071514 | B2 | * | 11/2012 | H01L 21/68707 |
| JP | 5293642 | B2 | * | 9/2013 | H01L 22/26 |
| JP | 2021518674 | A | | 8/2021 | |
| JP | 2021530870 | A | | 11/2021 | |
| JP | 2022500844 | A | | 1/2022 | |
| JP | 2022044512 | A | | 3/2022 | |
| KR | 20160001649 | U | * | 5/2016 | H01L 22/26 |
| KR | 101946592 | B1 | * | 2/2019 | G01B 11/002 |
| KR | 20190072419 | A | * | 6/2019 | H01L 21/67259 |
| KR | 20210146169 | A | * | 12/2021 | H01L 21/68 |
| TW | 202205494 | A | * | 2/2022 | G06T 7/73 |
| WO | 2012124803 | A1 | | 9/2012 | |

* cited by examiner

DETERMINING A SUBSTRATE LOCATION THRESHOLD BASED ON OPTICAL PROPERTIES

TECHNICAL FIELD

Embodiments of the present disclosure generally relate to the determination of an optical transmission ratio of a substrate, and more specifically relate to systems, methods and devices for determining a threshold for substrate location finding based on an optical properties of the substrate.

BACKGROUND

Accurately determining the location of a substrate as the substrate is handled is paramount in substrate processing. Particularly, accurately determining location can have a direct impact on the quality of processed substrates. The location of the substrate can be affected by a variety of factors, including accelerations during handling.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Some of the embodiments described herein cover a system that includes a first optical sensor that includes an emitting element and a receiving element. The first optical sensor is configured to detect an optical transmission ratio of a substrate responsive to a substrate support supporting the substrate in an optical path of the first optical sensor. The system further includes a processing device communicatively coupled to the first optical sensor. The processing device is configured to determine an optical threshold based on the optical transmission ratio of the substrate. The processing device is further configured to determine a location of the substrate relative to a substrate-handling robot end effector based on sensor data output by a location sensor and the optical threshold.

Additional or related embodiments described herein cover a method that includes receiving optical transmission data from a first optical sensor. The optical transmission data is indicative of an optical transmission ratio of a substrate positioned in an optical path of the first optical sensor. The method further includes determining an optical threshold based on the optical transmission data. The method further includes receiving location sensor data indicative of a position of the substrate along a substrate transport path. The method further includes determining a location of the substrate relative to a substrate-handling robot end effector based on the location sensor data and the optical threshold.

In further embodiments, a non-transitory machine-readable storage medium includes instructions that, when executed by a processing device, cause the processing device to perform operations including receiving data that includes one or more of optical transmission data associated with a substrate, first reflectance data associated with a first surface of the substrate, or second reflectance data associated with a second surface of the substrate. The operations further include inputting, into a trained machine learning model, one or more of the optical transmission data, the first reflectance data, or the second reflectance data. The operations further include receiving, from the trained machine learning model, an output indicating predicted substrate identification data. The predicted substrate identification data corresponds to one or more of a predicted corresponding substrate type, a predicted first property of the substrate, or a predicted second property of the substrate.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
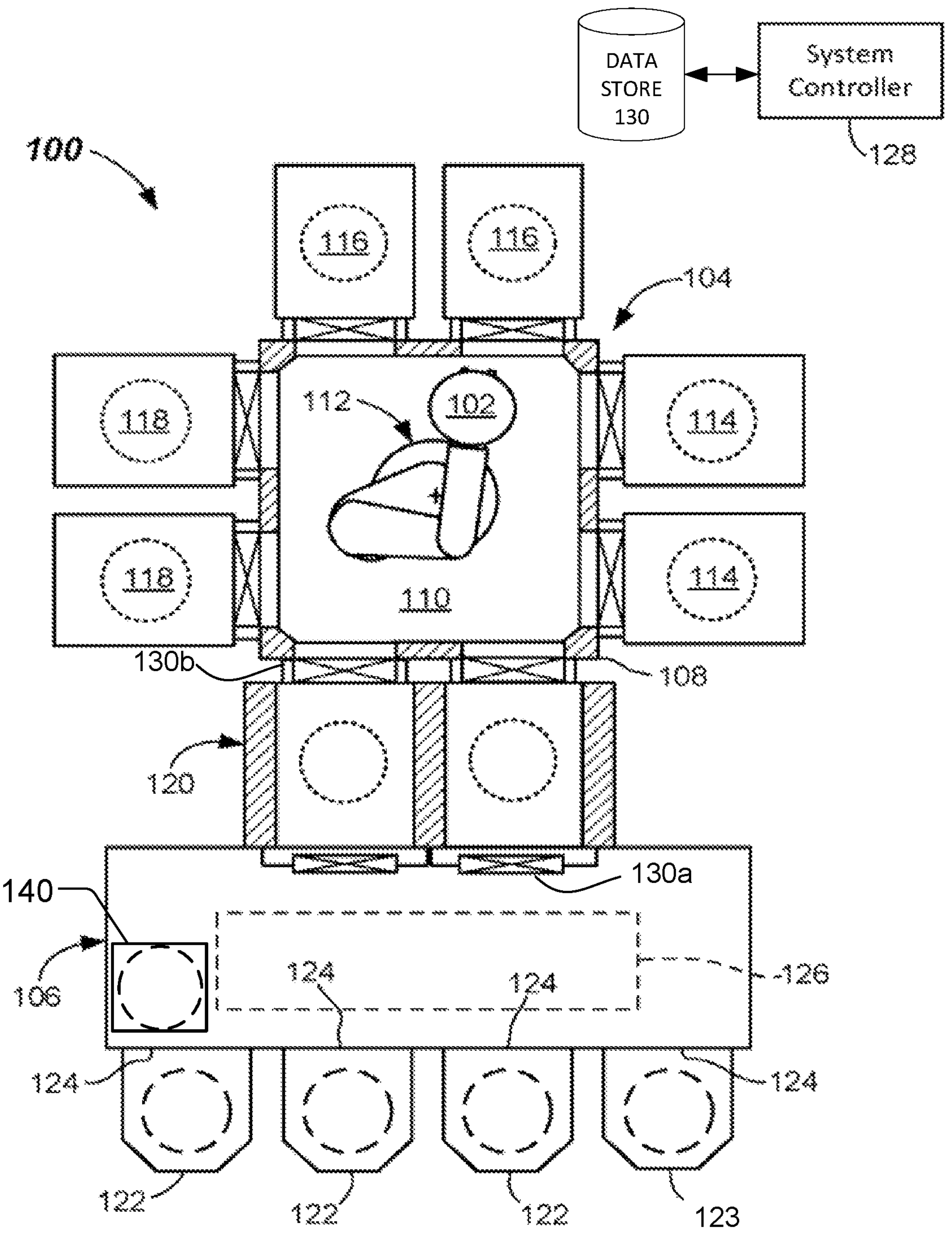
FIG. 1 is a top schematic view of an example manufacturing system, according to aspects of the present disclosure.

Embodiments of the present disclosure are directed to systems and methods for determining a substrate location threshold based on optical properties. Substrates are often handled by substrate-handling robots in a manufacturing system. A substrate-handling robot may pick up a substrate (e.g., via an end effector of the robot) and transport the substrate from one station in the manufacturing system to another. The robot may then place the transported substrate in the new station (e.g., in a process chamber, etc.). During transport, the substrate experiences accelerations that may cause the substrate to slide on the robot end effector. A shift in location on the end effector may cause the substrate to be inaccurately placed. Misplacement of the substrate can lead to erroneous processing of the substrate that in turn can lead to substrate damage. The damaged substrate may be scrapped after processing.

Conventional systems utilize location sensors to determine the location of the substrate relative to the robot end effector. In these conventional systems, a substrate that is transported breaks an optical beam emitted by an emitter of a location sensor. The time of the breaking of the beam is captured. Using the position of the robot (e.g., tracked by software) in combination with the time of the breaking of the optical beam, software can determine the location of the substrate relative to the robot end effector. However, some substrates transmit certain amounts of light and do not fully break the optical beam. In some instances, some substrates (e.g., glass substrates) transmit most of the optical beam between the transmitter and the receiver. The intensity of the optical beam received by the receiver of the location sensor may be reduced, but the beam may not be fully broken. The location sensor of conventional systems may thus not accurately detect the location of the substrate. Because the optical beam of the location sensor may be transmitted through at least some substrates, conventional systems may not be capable of accurately determining the location of substrates relative to the robot end effector. The location of substrates can be more accurately determined by setting a light intensity threshold (e.g., an optical threshold) that indicates the presence of a substrate to a substrate location sensor to trigger a sensor state change.

Further, substrate manufacturing systems may process multiple types of substrates. Some types of substrates may include glass substrates, silicon substrates, and bonded substrates (e.g., silicon bonded to glass). Some types of substrates can have different edge shapes and/or varying degrees of polishing. Further, some substrates may have different coatings compared to other substrates, and/or may have different coatings on different surfaces of the substrate (e.g., a first coating on a top surface of the substrate and a different second coating on a bottom surface of the substrate). Each substrate type may utilize different settings with regards to determining substrate location. For example, a glass substrate may transmit more light than a silicon substrate, necessitating the adjustment of the light intensity threshold (e.g., the optical threshold) corresponding to the location sensors. Without performing an adjustment of the threshold, the location sensor may not detect a change in light intensity sufficient to trigger a sensor state change (e.g., a state change indicative of the presence of the substrate at the location sensor). The adjustment can be done manually by adjusting the threshold corresponding to the location sensor. This adjustment can be slow and may not be feasible, especially if multiple types of substrates are routinely processed by the manufacturing system. Detection of the type of substrate currently being handled and/or processed can allow for the automatic updating of the optical threshold discussed herein above.

Aspects and implementations of the instant disclosure address the above-described and other shortcoming of conventional systems by providing a system (e.g., an optical property measuring system) to measure optical properties of a substrate. In some embodiments, a system includes a first optical sensor having an emitting element and a receiving element. The emitting element may emit an optical beam (e.g., a radiation beam, a light beam, etc.) toward the receiving element along an optical path of the first optical sensor. In some embodiments, a substrate support holds the substrate in the optical path. For example, the substrate support (e.g., a robot end effector, a substrate aligner, etc.) may hold the substrate such that the optical path is intersected by the substrate. The optical beam emitted by the emitting element therefore may pass through the substrate (e.g., the substrate transmits the optical beam) to the receiving element. Because of optical properties of the substrate (e.g., transmission ratio, reflectance, etc.), the emitting element may receive the optical beam at a reduced intensity.

In some embodiments, the system includes a processing device communicatively coupled to the first optical sensor. The processing device may receive optical transmission data from the first optical sensor. The processing device may determine an optical transmission ratio (e.g., a ratio of transmitted light to received light) corresponding to the substrate on the substrate support. In some embodiments, the processing device determines an optical threshold based on the optical transmission ratio of the substrate. The optical threshold may correspond to a threshold condition for determining the location of the substrate (e.g., by a location sensor). For example, a threshold amount of light (e.g., corresponding to the optical threshold) detected by a receiving element of a location sensor can indicate the presence of a corresponding substrate. In another example, the timing of a receiving element of a location sensor detecting a threshold amount of light (e.g., corresponding to the optical threshold) may correspond to the timing of the substrate "breaking the beam" of the location sensor as the substrate is moved past the location sensor by a substrate-handling robot. In some embodiments, the processing device can track the movement of a substrate-handling robot as the robot moves the substrate based on one or more robot position sensors (e.g., on the robot). Based on the optical threshold and sensor data output by a location sensor, the processing device may determine the location of the substrate relative to a substrate-handling robot end effector.

In some embodiments, the system may include a second optical sensor and/or a third optical sensor. Each of the second optical sensor and/or the third optical sensor may be configured to detect reflectance of the surfaces of the substrate (e.g., the top surface and/or the bottom surface of the substrate). Data from the second and/or third optical sensors can be used by the processing device to determine one or more properties of the substrate. In some examples, data collected by the second optical sensor may be indicative of the reflectance of the top surface of the substrate. The reflectance of the top surface can further be indicative of a coating (e.g., a coating or a film) on the top surface of the substrate. In some examples, data collected by the third optical sensor may be indicative of the reflectance of the bottom surface of the substrate. The reflectance of the bottom surface can further be indicative of a coating (e.g., a coating or a film) on the bottom surface of the substrate. By identifying one or more coatings (e.g., or films) on the substrate, the substrate can be successfully identified and settings for determining the substrate location (e.g., such as the light intensity threshold or optical threshold described herein) can be automatically updated.

Embodiments of the present disclosure provide advantages over conventional systems described above. Particularly, some embodiments described herein can detect the optical transmission ratio of a substrate handled in a substrate manufacturing system. The optical transmission ratio can be used to accurately determine the location of a substrate handled by a substrate-handling robot relative to a robot end effector. Accurately determining the location of the substrate can lead to more accurate substrate handling and more precise processing of the substrate when compared to conventional systems. Additionally, systems and methods described herein can predict substrate properties (e.g., via machine learning algorithms) allowing for the automatic updating of parameters associated with determining the location of a substrate. By automatically identifying the type of substrate being handled, the systems and methods of this disclosure can provide faster substrate handling and increased manufacturing system throughput.

FIG. 1 is a top schematic view of an example manufacturing system 100, according to aspects of the present disclosure. Manufacturing system 100 can perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 100 can include a process tool 104 and a factory interface 106 coupled to process tool 104. Process tool 104 can include a housing 108 having a transfer chamber 110 therein. Transfer chamber 110 can include one or more process chambers (also referred to as processing chambers) 114, 116, 118 disposed therearound and coupled thereto. Process chambers 114, 116, 118 can be coupled to transfer chamber 110 through respective ports, such as slit valves or the like.

Process chambers 114, 116, 118 can be adapted to carry out any number of processes on substrates 102. A same or different substrate process can take place in each process chamber 114, 116, 118. A substrate process can include atomic layer deposition (ALD), physical vapor deposition (PVD), chemical vapor deposition (CVD), etching, annealing, curing, pre-cleaning, metal or metal oxide removal, or the like. In one example, a PVD process can be performed in one or both of process chambers 114, an etching process can be performed in one or both of process chambers 116, and an annealing process can be performed in one or both of process chambers 118. Other processes can be carried out on substrates 102 therein. Process chambers 114, 116, 118 can each include a substrate support assembly. The substrate support assembly can be configured to hold substrate 102 in place while a substrate process is performed.

In some embodiments, a process chamber 114, 116, 118 can include a carousel (also referred to as a susceptor). The carousel can be disposed in an interior volume of the process chamber 114, 116, 118 and can be configured to rotate about an axial center at the process chamber 114, 116, 118 during a process (e.g., a deposition process) to ensure process gases are evenly distributed. In some embodiments, the carousel can include one or more end effectors configured to handle one or more objects. For example, the end effectors can be configured to hold a substrate, a process kit, and/or a process kit carrier. One or more sensors can be disposed at the process chamber 114, 116, 118 and can be configured to detect a placement of an object on an end effector of the carousel, in accordance with embodiments described herein.

Transfer chamber 110 can also include a transfer chamber robot 112. Transfer chamber robot 112 can include one or multiple arms where each arm includes one or more end effectors at the end of each arm. The end effector can be configured to handle particular objects, such as substrates. Alternatively, or additionally, the end effector can be configured to handle process kits (i.e., using a process kit carrier). In some embodiments, transfer chamber robot 112 can be a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106. Load lock 120 can have an environmentally-controlled atmosphere that can be changed from a vacuum environment (wherein substrates can be transferred to and from transfer chamber 110) to an at or near atmospheric-pressure inert-gas environment (wherein substrates can be transferred to and from factory interface 106) in some embodiments. In some embodiments, load lock 120 can be a stacked load lock having a pair of upper interior chambers and a pair of lower interior chambers that are located at different vertical levels (e.g., one above another). In some embodiments, the pair of upper interior chambers can be configured to receive processed substrates from transfer chamber 110 for removal from process tool 104, while the pair of lower interior chambers can be configured to receive substrates from factory interface 106 for processing in process tool 104. In some embodiments, load lock 120 can be configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers 122 (also referred to as containers) and load lock 120. In other and/or similar embodiments, factory interface 106 can be configured to receive replacement parts (e.g., process kits) from replacement parts storage containers 123. Factory interface robot 126 can include one or more robot arms and can be or include a SCARA robot. In some embodiments, factory interface robot 126 can have more links and/or more degrees of freedom than transfer chamber robot 112. Factory interface robot 126 can include an end effector on an end of each robot arm. The end effector can be configured to pick up and handle specific objects, such as substrates or process kits. Alternatively, or additionally, the end effector can be configured to handle objects such as process kits (e.g., using process kit carriers). In some embodiments, factory interface robot 126 may place substrates on an aligner 140 prior to and/or after transporting the substrates to load lock 120. The aligner 140 may be configured to align the substrates to a target alignment (e.g., a target orientation) for transport and/or processing.

Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

In some embodiments, transfer chamber 110, process chambers 114, 116, and 118, and load lock 120 can be maintained at a vacuum level. Manufacturing system 100 can include one or more vacuum ports that are coupled to one or more stations of manufacturing system 100. For example, first vacuum ports 130*a* can couple factory interface 106 to load locks 120. Second vacuum ports 130*b* can be coupled to load locks 120 and disposed between load locks 120 and transfer chamber 110.

In some embodiments, one or more sensors can be included at one or more stations of manufacturing system 100. For example, one or more sensors can be included in transfer chamber 110 at or near a port (i.e., an entrance) of process chambers 114, 116, 118. An end effector of a robot arm (e.g., of transfer chamber robot 112) can move a substrate 102 or a process kit (i.e. using a process kit carrier) past the one or more sensors when moving the substrate 102 and/or process kit into or out of a process chamber 114, 116, 118. Each sensor can be configured to detect the substrate 102 or the process kit and/or carrier as the end effector moves the substrate 102 or the process kit and/or carrier into or out of the process chamber 114, 116, 118. In some embodiments, one or more sensors included in manufacturing system 100 may be configured to sense one or more optical properties of substrates. For example, one or more optical sensors can be included in factory interface 106 to determine optical transmission ratio data of substrates, and/or reflectance data of substrates.

Manufacturing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions).

In some embodiments, the system controller 128 can receive optical transmission data corresponding to a substrate 102 from an optical sensor. The optical transmission data may be indicative of an optical transmission ratio of the substrate. In some embodiments, the optical transmission data is collected as a substrate support (e.g., an end effector of factory interface robot 126, aligner 140, etc.) moves the substrate 102 through the optical path of the optical sensor. The system controller 128 can determine a threshold of transmitted light (e.g., transmitted by the substrate 102) based on the optical transmission data. In some embodiments, the system control 128 may use the threshold (e.g., an optical threshold) for determining the presence of a substrate at a substrate location sensor station as described herein.

In some embodiments, system controller 128 can execute instructions to cause an end effector of a robot arm (e.g., of transfer chamber robot 112) to move an object (i.e., a substrate 102 and/or a process kit) from a first station (e.g., load lock 120) of manufacturing system 100 to a second station (e.g., process chamber 114, 116, 118) of manufacturing system 100. In response to executing the instructions to move the object from the first station to the second station, system controller 128 can receive a set of signals from one or more sensors included at an entrance to the first station or the second station (e.g., signals from one or more substrate location sensors). Each signal can indicate a location of the object placed at the end effector of the robot arm. In some embodiments, system controller 128 can determine a position of the object placed at the end effector of the robot arm based on each signal received from the one or more sensors. For example, system controller 128 can identify a first set of coordinates, based on the received signals, which correspond to a center of the object. System controller 128 can compare the first set of coordinates corresponding to the center of the object to a second set of coordinates corresponding to a center of the end effector to determine a correspondence between the first set of coordinates and the second set of coordinates. System controller 128 can determine whether the center of the object is placed at a target position relative to the center of the end effector based on the determined coordinate correspondence, in accordance with embodiments described herein. In some embodiments, the system controller 128 adjusts a threshold indicative of the presence of the object at the location sensor based on the optical threshold determined above. For example, the system controller 128 may detect a change in light intensity of the one or more location sensors corresponding to the optical threshold to determine that the object (e.g., the substrate 102) being transported (e.g., on an end effector) has passed the location sensor.

It should be noted that, although embodiments of the present disclosure are directed to identifying a center of an object placed on an end effector of a robot arm (e.g., of a transfer chamber robot or a factory interface robot), embodiments of the present disclosure can be applied to identifying a center of an object placed on other components of a manufacturing system. For example, an object can be placed on an end effector of a rotating carousel or a rotating susceptor at a process chamber 114, 116, 118, in accordance with embodiments described herein. One or more sensors can be disposed within the process chamber to detect a position of the object on the rotating carousel, in accordance with previously described embodiments. The one or more sensors can transmit signals to system controller 128, as previously described, and system controller 128 can detect a center of the object on the rotating susceptor based on the received signals, in accordance with embodiments described herein.

Figure 2A:
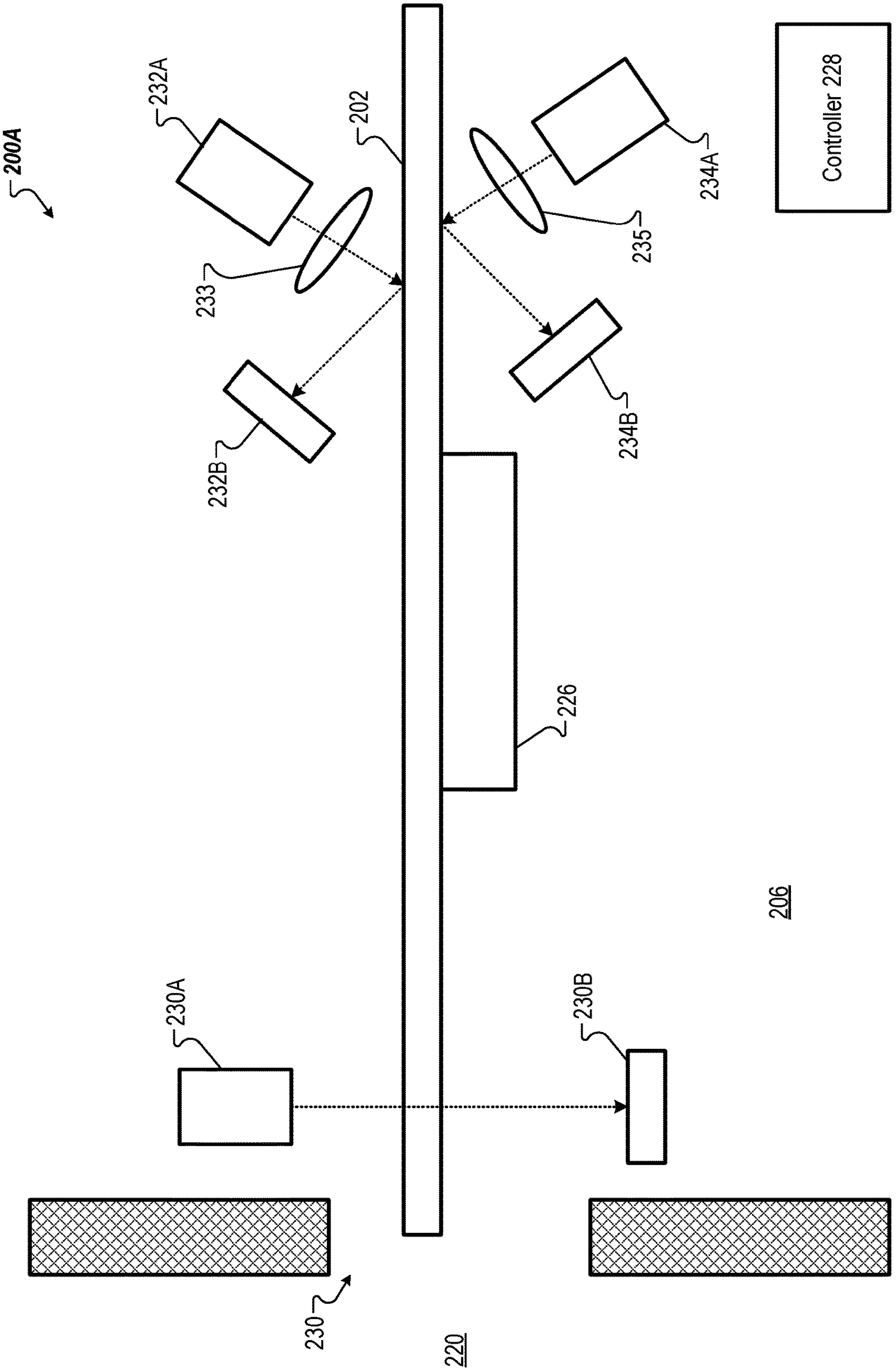
FIGS. 2A-2C illustrate simplified side views of systems for determining optical properties of a substrate, according to aspects of the present disclosure.
Figure 2B:
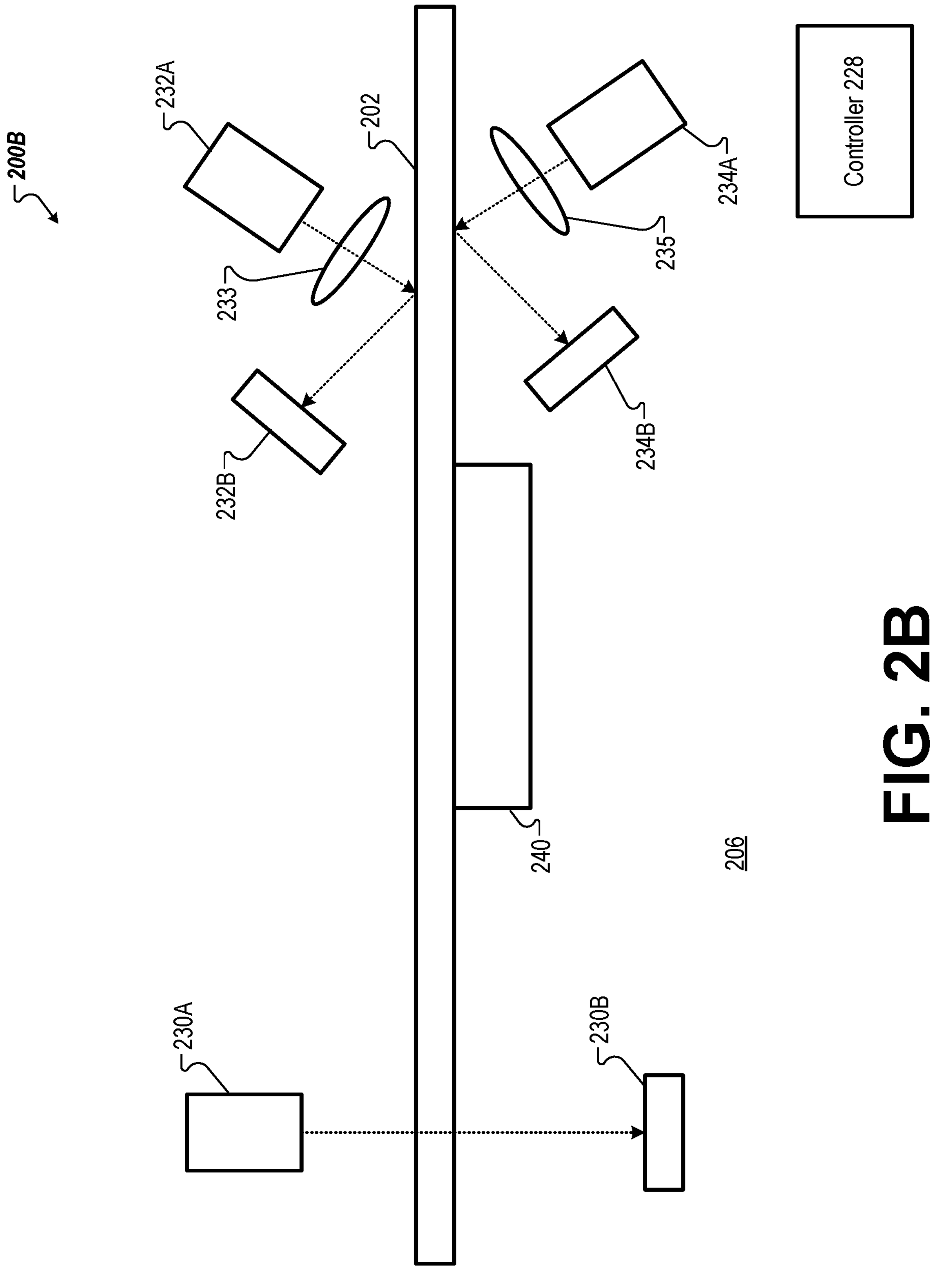
Figure 2C:
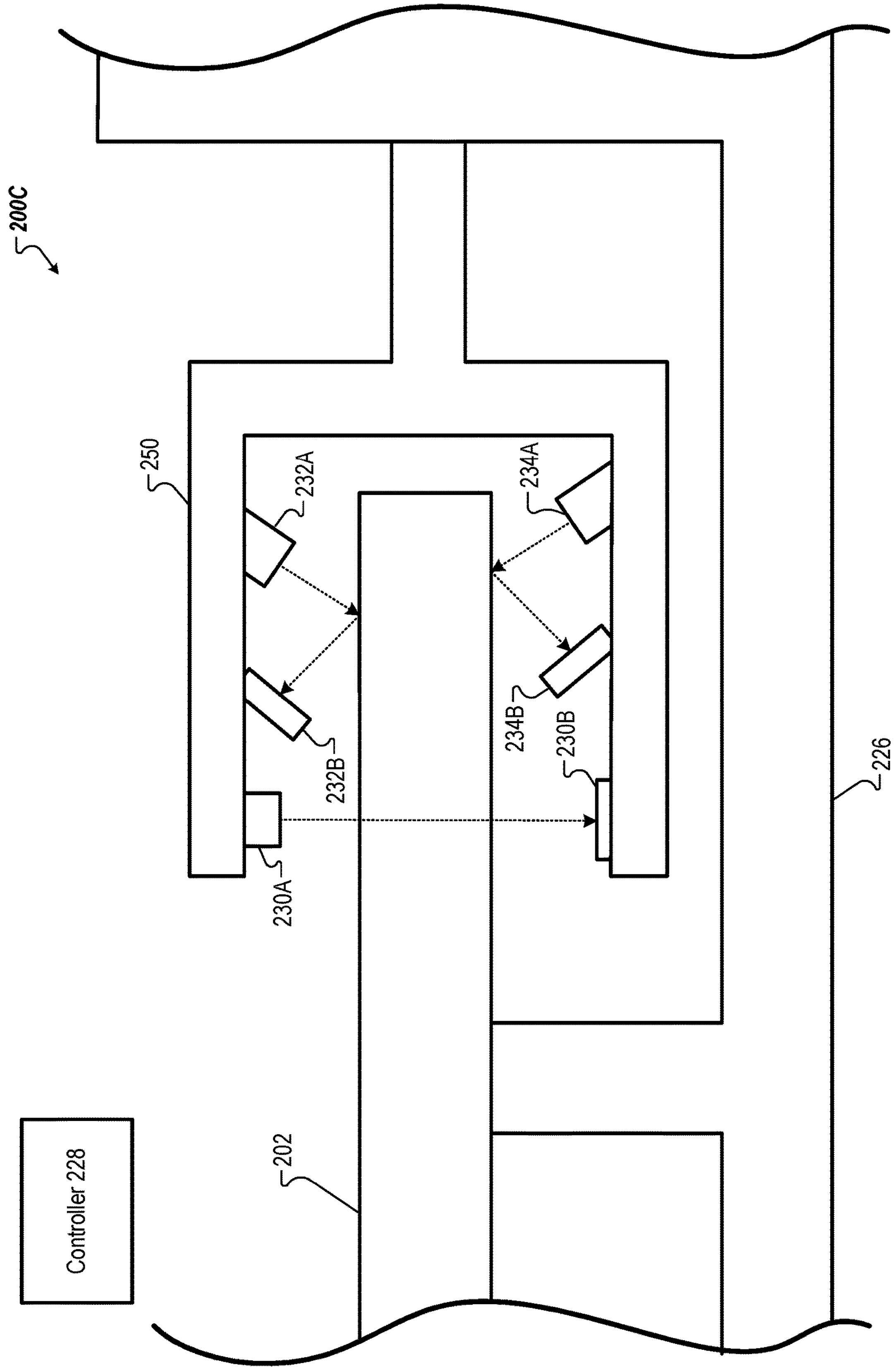

FIGS. 2A-2C illustrate simplified side views of systems for determining optical properties of a substrate, according to aspects of the present disclosure. FIG. 2A illustrates a simplified side view of a system 200A, according to aspects of the present disclosure. FIG. 2B illustrates a simplified side view of a system 200B, according to aspects of the present disclosure. FIG. 2C illustrates a simplified side view of a system 200C, according to aspects of the present disclosure. Each of systems 200A, 200B, and 200C are optical property measuring tools, in some embodiments.

Referring to FIG. 2A, a substrate 202 rests on a substrate support, such as robot end effector 226. The robot end effector may be a factory interface robot or a transfer chamber robot (e.g., factory interface robot 126 or transfer chamber robot 112 of FIG. 1). In some embodiments, the end effector 226 may transport the substrate 202 from a first station (such as a substrate carrier 122 of FIG. 1) to a second station (such as a load lock 120 of FIG. 1). In some embodiments, the end effector 226 may transport the substrate 202 from a factory interface chamber 206 through a vacuum port 230 (e.g., vacuum port 130*a* or 130*b* of FIG. 1, a slit valve, etc.) to a load lock 220. One or more sensors positioned proximate the vacuum port 230 may detect optical properties of substrate 202 as the substrate 202 is transported to the vacuum port 230. In some embodiments, as described herein, the one or more sensors may detect an optical transmission ratio of the substrate 202 and/or a reflectance of one or more surfaces of the substrate 202.

In some embodiments, system 200A includes a first optical sensor made up of an emitting element and a receiving element. In some embodiments, the emitting element is an optical transmitter 230A and the receiving element is an optical receiver 230B. Optical transmitter 230A may be configured to emit an optical beam (e.g., a light beam, a laser beam, an optical radiation beam, etc.) substantially orthogonal to the top surface of the substrate 202. In some examples, optical transmitter 230A is a light-emitting diode (LED) or a laser diode. In some embodiments, an optical fiber (e.g., fiber optic) delivers an optical beam to the optical transmitter 230A from a remote source. Optical receiver 230B may be configured to receive an optical beam (e.g., from optical transmitter 230A). The optical beam received by the optical receiver 230B may travel along an optical path from the optical transmitter 230A to the optical receiver 230B. In some examples, optical receiver 230B is a photo diode, a line sensor, or a position sensing device (PSD). In some embodiments, an optical fiber receives an optical beam from the optical receiver 230B and delivers the optical beam to a remote sensor.

In some embodiments, the optical beam emitted by the optical transmitter 230A is transmitted through the substrate 202 (e.g., as the substrate 202 is transported through the optical path between the optical transmitter 230A and the optical receiver 230B by the end effector 226). The intensity of the optical beam received by the optical receiver 230B may be indicative of the optical transmission of the substrate 202. An optical transmission ratio of the substrate 202 may be calculated by controller 228 (e.g., system controller 128 of FIG. 1) based on a ratio of the intensity of the optical beam received (e.g., by the optical receiver 230B) to the intensity of the optical beam transmitted (e.g., by the optical transmitter 230A). In some embodiments, either one of the optical transmitter 230A or the optical receiver 230B may include a lens to focus the optical beam. In some embodiments, the first optical sensor (e.g., optical transmitter 230A and optical receiver 230B) is communicatively coupled to controller 228. Sensor data from the first optical sensor may be received by the controller 228.

The optical transmission ratio of the substrate 202 can be used to determine an optical threshold corresponding to a threshold amount of transmitted light for accurately determining the location of the substrate 202 by one or more location sensors of a substrate processing system. For example, a substrate may have an optical transmission ratio of 0.5, corresponding to 50% (e.g., half) of the intensity of emitted light transmitting through the substrate. Thus, when the substrate is transported through a beam of a substrate location sensor, the location sensor will detect a 50% reduction in light at the receiver of the location sensor. The corresponding optical threshold for detecting the substrate may be marginally above 50% (e.g., about 55%, about 60%, etc.) so that the location sensor successfully and accurately detects the presence of the substrate and can thus accurately determine the location of the substrate. In this example, the reduction of received light below about 55% (or about 60%) indicates that the edge of a substrate has passed the location sensor. In another example, a substrate may have an optical transmission ratio of 0.95, corresponding to 95% of the intensity of emitted light transmitting through the substrate. Thus, when the substrate is transported through a beam of a substrate location sensor, the location sensor will detect a 95% reduction in light at the receiver of the location sensor. Using the optical threshold from the previous example (e.g., about 55% or about 60%), the sensor cannot detect the presence of the substrate. Instead, using an optical threshold of about 97% (e.g., corresponding to a reduction of light below 97%), the location sensor can detect the presence of the substrate. In this example, the reduction of received light below about 97% indicates that the edge of the substrate has passed the location sensor.

In some embodiments, the optical transmission ratio of the substrate 202 can be used with other optical properties (e.g., reflectance, etc.) to determine an identification of the substrate 202 (e.g., identification of substrate type, identification of one or more coatings on the substrate, etc.) as described herein. In some embodiments, the controller can determine whether the substrate 202 is a glass substrate, a silicon substrate, or a bonded substrate, etc. based on the optical properties of the substrate 202.

In some embodiments, system 200A includes a second optical sensor made up of an optical transmitter 232A and an optical receiver 232B. The second optical sensor may include a lens 233 in some embodiments. The optical transmitter 232A and the optical receiver 232B may be substantially similar to optical transmitter 230A and optical receiver 230B (e.g., have similar structure, components, characteristics, etc.). In some embodiments, the optical transmitter 232A is configured to emit an optical beam at an oblique angle to the top surface of the substrate 202. The optical beam may be focused onto the top surface of the substrate 202 by the lens 233. A portion of the optical beam may reflect off the top surface of the substrate 202 and be received by the optical receiver 232B. In some embodiments, the intensity of the portion of the optical beam received by the optical receiver 232B can be used to determine the reflectance of the top surface of the substrate 202. In some examples, a ratio of the intensity of the optical beam received by the optical receiver 232B to the intensity of the optical beam emitted by the optical transmitter 232A is indicative of the reflectance of the top surface of the substrate 202. The reflectance of the top surface of the substrate 202 can be used to identify the substrate 202 (e.g., identify the type of substrate, identify a coating on the top surface of the substrate, etc.). In some embodiments, the identification of the substrate 202 is performed using a machine learning algorithm as described herein below. In some embodiments, the second optical sensor (e.g., optical transmitter 232A and optical receiver 232B) is communicatively coupled to controller 228. Sensor data from the second optical sensor may be received by the controller 228.

In some embodiments, system 200A includes a third optical sensor made up of an optical transmitter 234A and an optical receiver 234B. The third optical sensor may include a lens 233 in some embodiments. The optical transmitter 234A and the optical receiver 234B may be substantially similar to optical transmitter 232A and optical receiver 232B. In some embodiments, the optical transmitter 234A is configured to emit an optical beam at an oblique angle to the bottom surface of the substrate 202. The optical beam may be focused onto the bottom surface of the substrate 202 by the lens 235. A portion of the optical beam may reflect off the bottom surface of the substrate 202 and be received by the optical receiver 234B. In some embodiments, the intensity of the portion of the optical beam received by the optical receiver 234B can be used to determine the reflectance of the bottom surface of the substrate 202. In some examples, a ratio of the intensity of the optical beam received by the optical receiver 234B to the intensity of the optical beam emitted by the optical transmitter 234A is indicative of the reflectance of the bottom surface of the substrate 202. The reflectance of the bottom surface of the substrate 202 can be used to identify the substrate 202 (e.g., identify the type of substrate, identify a coating on the bottom surface of the substrate, etc.). In some embodiments, the identification of the substrate 202 is performed using a machine learning algorithm as described herein below. In some embodiments, the optical threshold can be automatically updated (e.g., by the controller 228) based on the identification of the substrate 202. In some embodiments, the third optical sensor (e.g., optical transmitter 234A and optical receiver 234B) is communicatively coupled to controller 228. Sensor data from the third optical sensor may be received by the controller 228.

In some embodiments, the controller 228 can determine a coating on the top surface of the substrate 202 and/or a coating on the bottom surface of the substrate 202 based on reflectance data collected via the optical receiver 232B and/or optical receiver 234B. In some embodiments, the controller 228 makes this determination via a machine learning algorithm as described herein below. In some embodiments, the controller 228 may determine a corrective action based on the optical transmission sensor data and/or based on the reflectance sensor data. For example, the controller 228 may determine that a coating on the top surface of the substrate 202 does not match an expected top surface coating. Additionally, the controller 228 may determine that the coating on the bottom surface of the substrate 202 matches the expected top surface coating. The controller may determine that the substrate 202 is to be flipped responsive to determining the top and/or bottom surface substrate coatings.

In some embodiments, the first optical sensor (optical transmitter 230A and optical receiver 230B), the second optical sensor (optical transmitter 232A and optical receiver 232B), and/or the third optical sensor (optical transmitter 234A and optical receiver 234B) may be supported within the factory interface chamber 206 by a bracket (not illustrated). In some embodiments, the bracket can be coupled to an interior wall of the factory interface chamber 206.

Referring to FIG. 2B, system 200B includes the optical sensors of system 200A. In some embodiments, the substrate 202 is supported by a stage of an aligner 240 inside factory interface chamber 206. The optical sensors may be supported (e.g., by a bracket) proximate the aligner 240. In some examples, a factory interface robot retrieves the substrate 202 (e.g., from a load lock or a substrate carrier) and places the substrate 202 on the aligner 240. While the substrate 202 is aligned to a target orientation by the aligner 240, the optical sensors may determine one or more optical properties of the substrate 202 (e.g., optical transmission ratio, reflectance, etc.). After the substrate 202 is aligned and optical properties determined, the factory interface robot may remove the substrate 202 from the aligner.

Referring to FIG. 2C, system 200C includes the optical sensors of system 200A. In some embodiments, the optical sensors are supported by a sensor support structure 250 coupled to a robot end effector 226. The optical sensors may measure optical properties of the substrate 202 while the substrate 202 is supported by the end effector 226. In some embodiments, the sensor support structure 250 is a substantially Y-shaped bracket coupled to the end effector 226 at a distal end. The sensor support structure 250 may be configured to move between an extended position and a retracted position responsive to handling of the substrate 202 by the end effector 226. For example, when the end effector 226 picks up a substrate 202 from a first station, the sensor support structure 250 may be in the retracted position (not illustrated) to allow clearance for the substrate 202. Upon picking up the substrate, the sensor support structure 250 may move to the extended position (illustrated in FIG. 2C) so that the substrate 202 intersects an optical path of the first optical sensor (e.g., made up of optical transmitter 230A and optical receiver 230B). The optical sensors may then measure the optical properties of the substrate 202. In preparation for placing the substrate at a second (e.g., new) station, the sensor support structure 250 may move to the retracted position to provide clearance for the off-loading of the substrate 202 from the end effector 226. In some embodiments, the sensor support structure 250 extends and retracts linearly (e.g., along a substantially linear path). In some embodiments, the sensor support structure 250 pivots about an axis (e.g., a vertical axis) to extend and retract.

Figure 3:
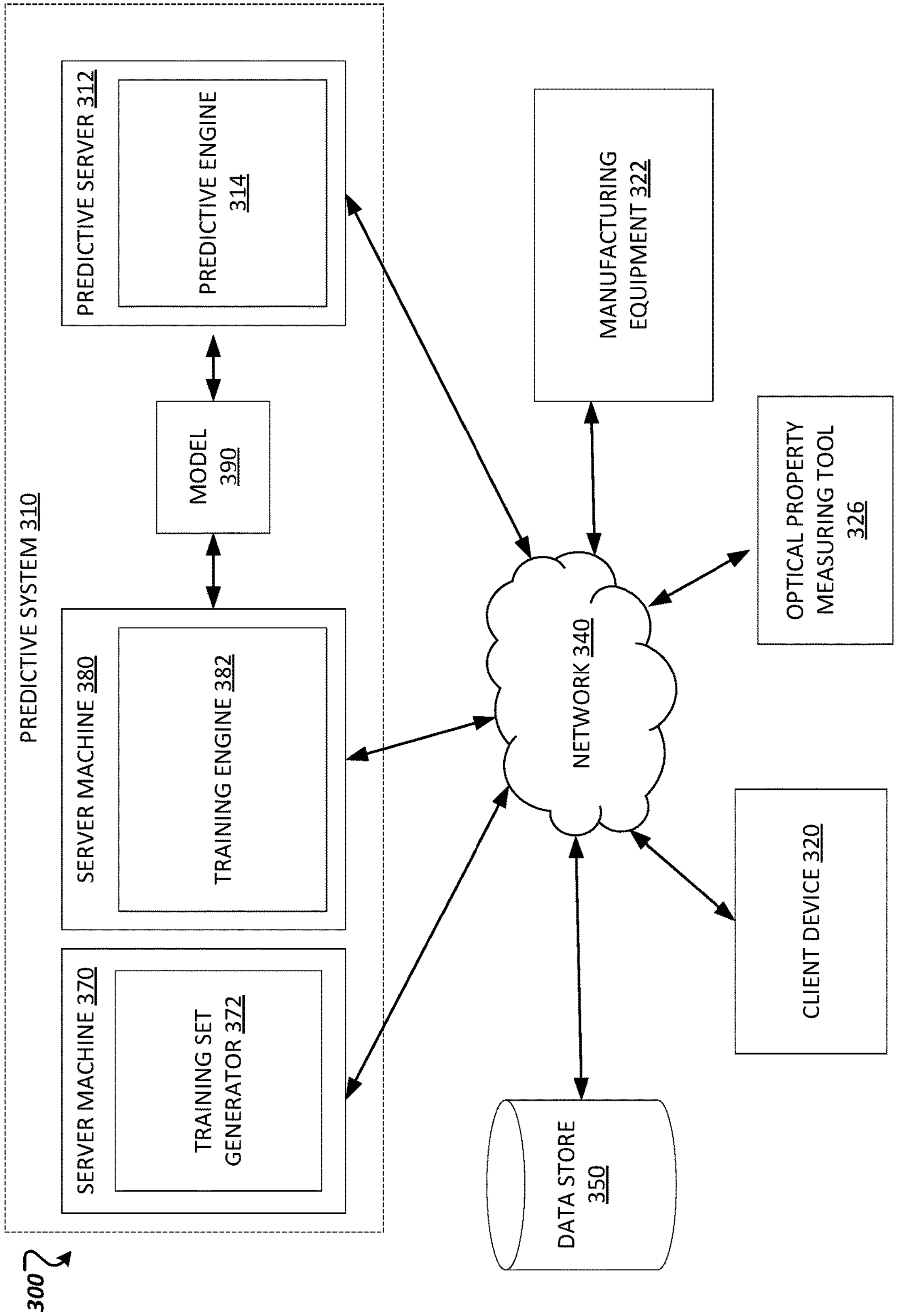
FIG. 3 depicts an illustrative computer system architecture, according to aspects of the present disclosure.

FIG. 3 depicts an illustrative computer system architecture 300, according to aspects of the present disclosure. Computer system architecture 300 includes a client device 320, manufacturing equipment 322, optical property measuring tool 326, a predictive server 312 (e.g., to generate predictive data, to provide model adaptation, to use a knowledge base, etc.), and a data store 350. The predictive server 312 can be part of a predictive system 310. The predictive system 310 can further include server machines 370 and 380. In some embodiments, computer system architecture 300 can include or be a part of a manufacturing system for processing substrates, or optical property measuring tool 326. Further details regarding the optical property measuring tool 326 are provided with respect to FIGS. 2A-2C.

Components of the client device 320, manufacturing equipment 322, optical property measuring tool 326, predictive system 310, and/or data store 350 can be coupled to each other via a network 340. In some embodiments, network 340 is a public network that provides client device 320 with access to predictive server 312, data store 350, and other publicly available computing devices. In some embodiments, network 340 is a private network that provides client device 320 access to manufacturing equipment 322, optical property measuring tool 326, data store 350, and/or other privately available computing devices. Network 340 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 320 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc.

Manufacturing equipment 322 can produce products following a recipe. In some embodiments, manufacturing equipment 322 can include or be a part of a manufacturing system that includes one or more stations (e.g., process chambers, transfer chamber, load lock, factory interface, etc.) configured to perform different operations for a substrate.

Optical property measuring tool 326 may be a tool (e.g., a system) for determining one or more optical properties of a measured object. The optical property measuring tool 326 may be configured to generate data associated with the optical transmission and/or reflectance of an object measured by the optical measuring tool 326. In some embodiments, optical property measuring tool 326 corresponds to system 200A, system 200B, or system 200C. In some embodiments, such data (e.g., optical transmission data, first reflectance data, second reflectance data, etc.) can be stored in data store 350 where the data can be accessed (e.g., via network 340). The optical property measuring tool 326 can include one or more sensors (e.g., multiple optical sensors) configured to detect optical properties and generate data associated with the measured object. In some embodiments, the optical property measuring tool 326 includes a first optical sensor configured to detect optical transmission of light through a substrate. In some embodiments, the optical property measuring tool 326 includes a second optical sensor and/or a third optical sensor configured to detect first reflectance of a first surface of the substrate and/or second reflectance of a second surface of the substrate. In some embodiments, the optical property measuring tool 326 can generate optical transmission data and/or reflectance data based on intensities of received light (e.g., by the receiving element of each of the corresponding optical sensors). In some embodiments, the optical measuring tool 326 can be included in systems used to manufacture components (e.g., processing chamber components) of manufacturing equipment 322. In some embodiments, the optical properties measured by the optical property measuring tool 326 (e.g., optical transmission, reflectance, etc.) can be used to identify substrates handled and/or processed by manufacturing equipment 322. In some embodiments, the optical properties can be used to accurately determine the location of a substrate undergoing transport (e.g., within manufacturing equipment 322).

Data store 350 can be a memory (e.g., random access memory), a drive (e.g., a hard drive, a flash drive), a database system, or another type of component or device capable of storing data. Data store 350 can include multiple storage components (e.g., multiple drives or multiple databases) that can span multiple computing devices (e.g., multiple server computers). The data store 350 can store optical transmission data and reflectance data (e.g., generated by optical property measuring tool 326).

One or more portions of data store 350 can be configured to store data that is not accessible to a user of the manufacturing system. In some embodiments, all data stored at data store 350 can be inaccessible by the manufacturing system user. In other or similar embodiments, a portion of data stored at data store 350 is inaccessible by the user while another portion of data stored at data store 350 is accessible to the user. In some embodiments, inaccessible data stored at data store 350 is encrypted using an encryption mechanism that is unknown to the user (e.g., data is encrypted using a private encryption key). In other or similar embodiments, data store 350 can include multiple data stores where data that is inaccessible to the user is stored in a first data store and data that is accessible to the user is stored in a second data store.

In some embodiments, predictive system 310 includes server machine 370 and server machine 380. Server machine 370 includes a training set generator 372 that is capable of generating training data sets (e.g., a set of data inputs and a set of target outputs) to train, validate, and/or test a machine learning model 390 or set of machine learning models 390. Some operations of training set generator 372 are described in detail below with respect to FIGS. 5 and 6A. In some embodiments, the training set generator 372 can partition the training data into a training set, a validating set, and a testing set.

Server machine 380 can include a training engine 382. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 382 can be capable of training a machine learning model 390 or a set of machine learning models 390. The machine learning model 390 can refer to the model artifact that is created by the training engine 382 using the training data. The training data may include training inputs and corresponding target outputs (correct answers for respective training inputs). The training engine 382 can find patterns in the training data that map the training input to the target output (the answer to be predicted). The training engine 382 can then ultimately provide the machine learning model 390 that captures these patterns. The machine learning model 390 can include a linear regression model, a partial least squares regression model, a Gaussian regression model, a random forest model, a support vector machine model, a neural network, a ridge regression model, and so forth. In some embodiments, the machine learning model 390 is a physics-based model instead of or in addition to a machine learning model.

Training engine 382 can also be capable of validating a trained machine learning model 390 using a corresponding set of features of a validation set from training set generator 372. In some embodiments, training engine 382 can assign a performance rating for each of a set of trained machine learning models 390. A performance rating can correspond to an accuracy of a respective trained model, a speed of the respective model, and/or an efficiency of the respective model. Training engine 382 can select a trained machine learning model 390 having a performance rating that satisfies a performance criterion to be used by predictive engine 314, in accordance with some embodiments described herein. Further details regarding training engine 382 are provided with respect to FIG. 6A.

Predictive server 312 includes a predictive engine 314 that is capable of providing data from optical property measuring tool 326 (e.g., optical transmission data and/or reflectance data) as input to trained machine learning model 390. Predictive engine 314 may execute trained model 390 on the input to obtain one or more outputs. In embodiments, trained model 390 is trained on training data that includes historical substrate optical transmission data, historical substrate reflectance data, and corresponding substrate identification data such as corresponding substrate type data and historical substrate property data (e.g., historical substrate coating data). As described further with respect to FIG. 6B, in some embodiments, predictive engine 314 processes input data (e.g., optical transmission and/or optical reflectance) using model 390 to predict substrate identification.

It should be noted that in some other implementations, the functions of server machines 370 and 380, as well as predictive server 312, can be provided by a larger or smaller number of machines. For example, in some embodiments, server machines 370 and 380 can be integrated into a single machine. In other embodiments, server machines 370 and 380 and/or predictive server 312 can be integrated into a single machine. In general, functions described in one implementation as being performed by server machine 370, server machine 380, and/or predictive server 312 can also be performed on client device 320. In addition, the functionality attributed to a particular component can be performed by different or multiple components operating together.

Figure 4:
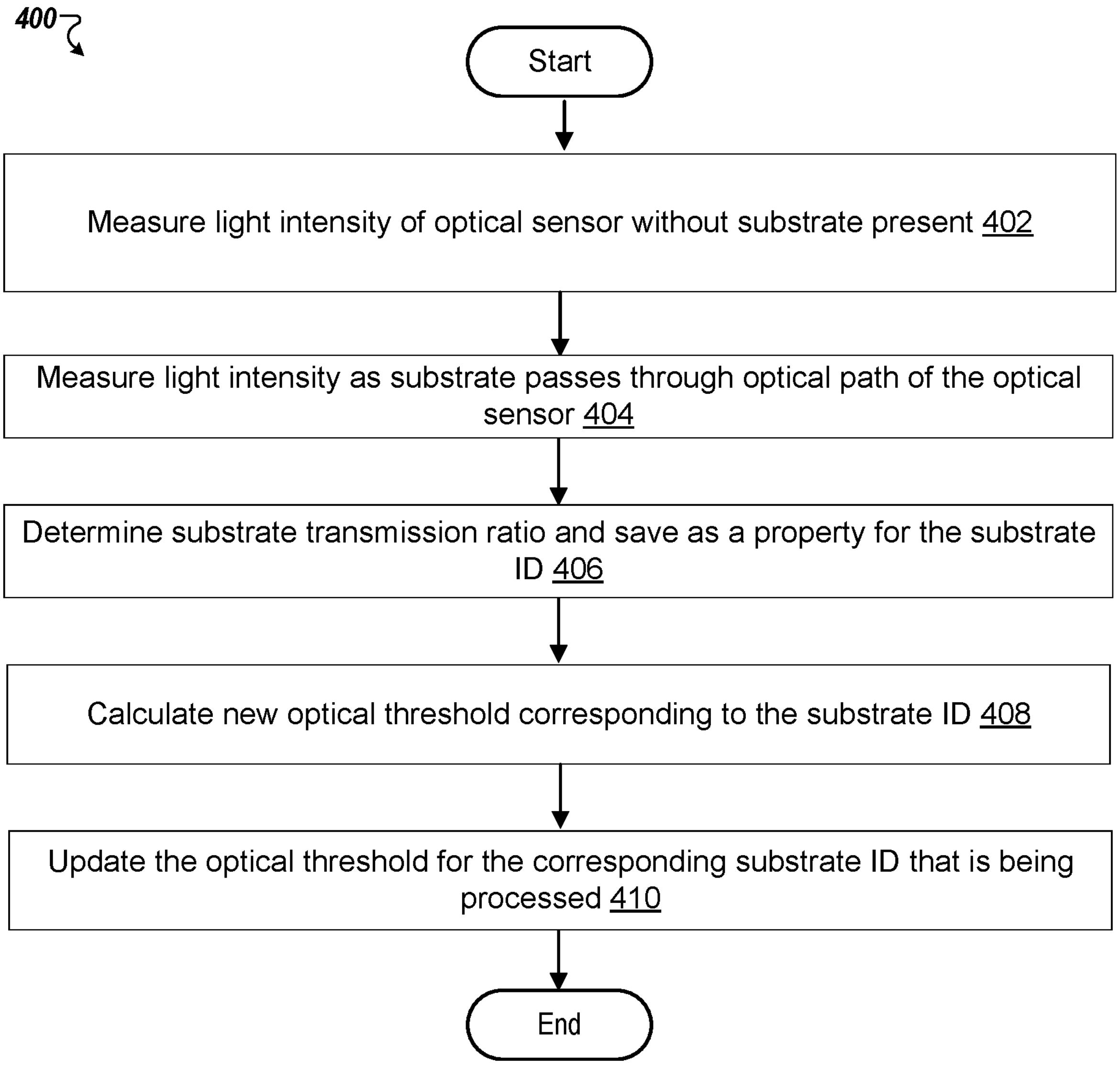
FIG. 4 is a flow chart of a method for updating an optical threshold corresponding to a substrate ID, according to aspects of the present disclosure.

FIG. 4 is a flow chart of a method 400 for updating an optical threshold corresponding to a substrate ID, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by a computer system, such as computer system architecture 300 of FIG. 3. In other or similar implementations, one or more operations of method 400 can be performed by one or more other machines not depicted in the figures.

At block 402, processing logic measures the light intensity of an optical sensor without a substrate present. The optical sensor may be a first optical sensor of an optical property measuring tool (e.g., made up of optical transmitter 230A and optical receiver 230B of FIGS. 2A-2C). Measuring the light intensity without a substrate present may provide a benchmark light intensity value and/or an initial normalized calibration value.

At block 404, light intensity of the optical sensor is measured as a substrate is moved (e.g., by a substrate-handling robot end effector) through an optical path of the optical sensor. A portion of the light emitted by an emitting element of the optical sensor may be transmitted through the substrate to a receiving element of the optical sensor. The light intensity measured at block 404 may be substantially less than the intensity measured at block 402. In some embodiments, the tendency of the substrate to transmit light may affect the light intensity measured at block 404. For example, a substrate that transmits less light will result in a lower intensity of light measured at block 404, while a substrate that transmits more light will result in a higher intensity of light measured at block 404.

At block 406, processing logic determines an optical transmission ratio of the substrate. The optical transmission ratio may be a ratio of the light intensity measured at block 404 to the light intensity measured at block 402. In some embodiments, the optical transmission ratio of the substrate is saved as a property for the substrate ID. The substrate ID may be a collection of data (e.g., substrate type, substrate coatings, substrate optical transmission ratio, etc.) corresponding to the substrate. The substrate ID can be used to automatically update manufacturing system parameters (e.g., such as optical threshold as described herein) for handling and/or processing the substrate.

At block 408, processing logic calculates an optical threshold corresponding to the substrate ID (e.g., a threshold of detected light intensity of a substrate location sensor as described herein). In some embodiments, the optical threshold is calculated (e.g., determined) based on the optical transmission ratio.

At block 410, processing logic updates the optical threshold for the corresponding substrate ID that is being processed. One or more location sensors may use the updated optical threshold for determining the location of the substrate during handling. In some embodiments, the new (e.g., updated) optical threshold is saved as a property for the substrate ID.

Figure 5:
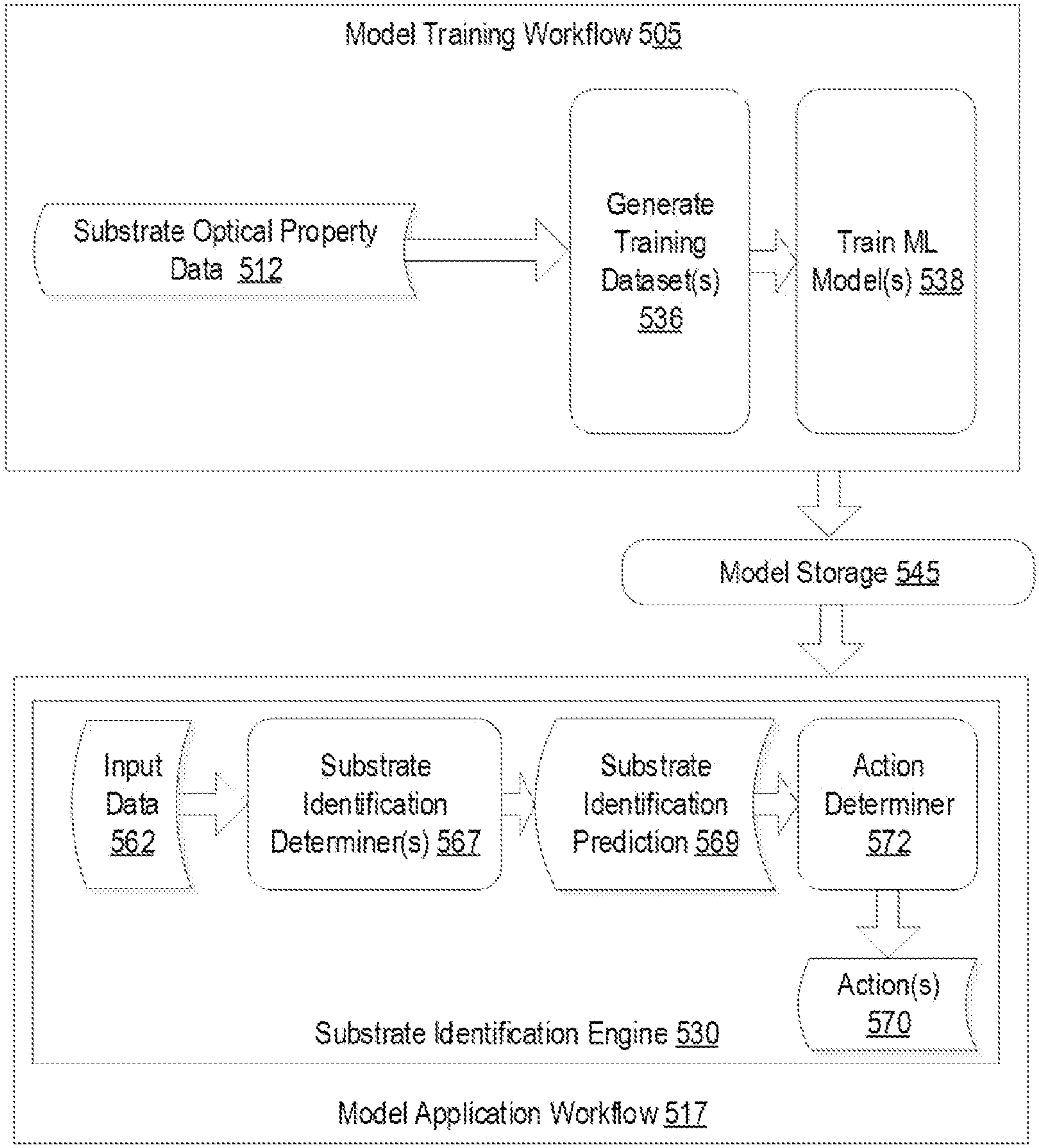
FIG. 5 illustrates a model training workflow and a model application workflow for determining predicted substrate identifications, according to aspects of the present disclosure.

FIG. 5 illustrates a model training workflow 505 and a model application workflow 517 for determining predicted substrate identifications from substrate optical property data, according to one embodiment. Model training workflow 505 and model application workflow 517 may be performed by processing logic executed by a processor of a computing device. One or more of these workflows 505, 517 may be implemented, for example, by one or more machine learning models implemented on a processing device and/or other software and/or firmware executing on a processing device.

The model training workflow 505 is to train one or more machine learning models (e.g., deep learning models) to determine predicted substrate identifications. Model application workflow 517 is to apply the one or more trained machine learning models to perform substrate identification. Each of the substrate optical property data 512 may include optical transmission data and/or reflectance data (e.g., first reflectance data of a first surface and/or second reflectance data of a second surface) corresponding to one or more measured substrates. In some embodiments, the substrate optical property data may be generated via systems 200A, 200B, or 200C as described herein above.

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting.

In some embodiments, one or more machine learning models are trained to perform one or more substrate identification tasks. Each task may be performed by a separate machine learning model. Alternatively, a single machine learning model may perform each of the tasks or a subset of the tasks. For example, a first machine learning model may be trained to determine a substrate identification, and a second machine learning model may be trained to determine a corresponding corrective action. Additionally, or alternatively, different machine learning models may be trained to perform different combinations of the tasks. In an example, one or a few machine learning models may be trained. The trained machine learning (ML) model may be a single shared neural network that has multiple shared layers and multiple higher level distinct output layers, where each of the output layers outputs a different prediction, classification, identification, etc. For example, a first higher level output layer may determine a substrate identification based on input data corresponding to a first substrate, and a second higher level output layer may determine a substrate identification based on input data corresponding to a second substrate.

One type of machine learning model that may be used to perform some or all of the above tasks is an artificial neural network, such as a deep neural network. Artificial neural networks generally include a feature representation component with a classifier or regression layers that map features to a target output space. A convolutional neural network (CNN), for example, hosts multiple layers of convolutional filters. Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

For model training workflow 505, a training dataset containing hundreds, thousands, tens of thousands, hundreds of thousands or more instances of substrate optical property data 512 (e.g., optical transmission data, reflectance data, etc.) should be used to form a training dataset. Data may include, for example, a substrate optical transmission ratio determined using a given number of measurements. Data may further include, for example, a first reflectance value of a first surface of a substrate (e.g., a top surface of a substrate) and/or a second reflectance value of a second surface of a substrate (e.g., a bottom surface of a substrate). This data may be processed to generate one or more training datasets 536 for the training of one or more machine learning models. Training data items in training datasets 536 may include substrate optical property data 512, corresponding substrate identification data (e.g., an identification of a type of corresponding substrate, an identification of a coating on a corresponding substrate, etc.), and/or one or more images of the substrates.

To effectuate training, processing logic inputs the training dataset(s) 536 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above. Training may be performed by inputting input data such as substrate optical property data 512, images, and/or substrate identification data into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences (e.g., predicted substrate type identifications, predicted substrate coatings, etc.). Processing logic may compare the output predicted substrate identifications against historical substrate identifications. Processing logic determines an error (i.e., a classification error) based on the differences between the predicted substrate identifications and the target substrate identifications. Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed data from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model. Once one or more trained machine learning models 538 are generated, they may be stored in model storage 545, and may be added to substrate identification engine 530.

For model application workflow 517, according to one embodiment, input data 562 may be input into one or more substrate identification determiners 567, each of which may include a trained neural network or other model. Additionally, or alternatively, one or more substrate identification determiner(s) 567 may apply data processing algorithms to determine substrate identifications. The input data may include substrate optical transmission data and/or substrate reflectance data (e.g., measured/generated using an optical property measuring tool as described herein). The input data may additionally optionally include one or more images of the measured substrate. Based on input data 562, substrate identification determiner(s) 567 may output one or more substrate identification prediction(s) 569. The substrate identification prediction(s) 569 may include a predicted identification (e.g., type, coating, etc.) of an analyzed substrate.

An action determiner 572 may determine, based on the substrate identification prediction(s) 569, one or more actions 570 to perform. In one embodiment, action determiner 572 compares the substrate identification prediction (s) 569 to one or more expected substrate identifications. If one or more of the substrate identification prediction(s) 569 does not match an expected substrate identification, then action determiner 572 may determine that a corrective action is recommended. In such an instance, action determiner 572 may output a recommendation or notification to perform a corrective action (e.g., such as flipping the substrate, updating a process recipe, etc.). In some embodiments, action determiner 572 automatically updates process parameters(s) based on substrate identification prediction(s) 569 meeting one or more criteria. In some examples, substrate identification prediction(s) 569 may include an estimated optical threshold (e.g., a light intensity threshold) for locating the substrate by a location sensor. In some embodiments, the estimated optical threshold can be used to determine the location of the substrate in relation to a robot end effector while the substrate is transported.

Figure 6A:
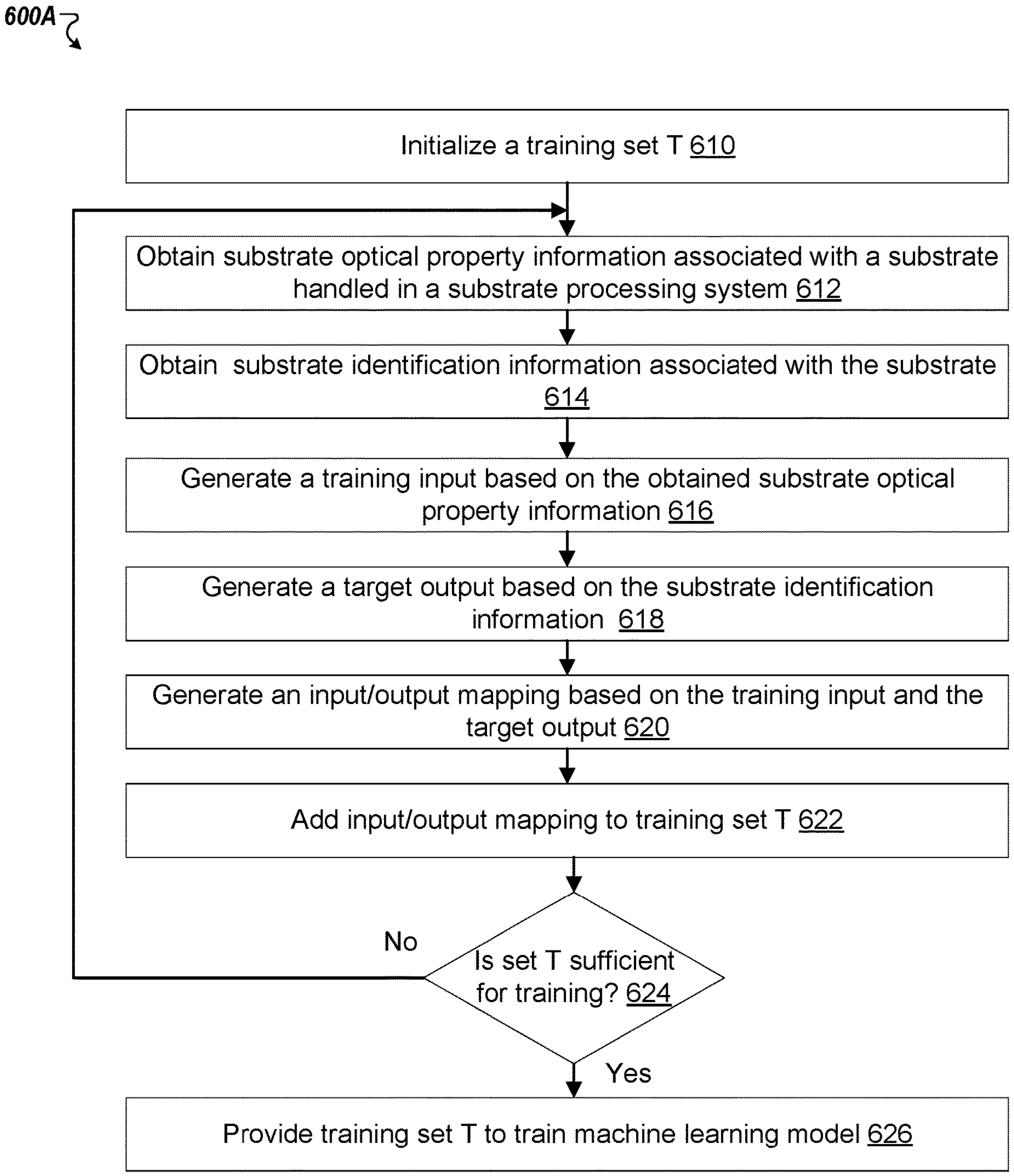
FIG. 6A is a flow chart of a method for generating a training dataset for training a machine learning model, according to aspects of the present disclosure.

FIG. 6A is a flow chart of a method 600A for generating a training dataset for training a machine learning model to perform substrate identification, according to aspects of the present disclosure. Method 600A is performed by processing logic that can include hardware (circuitry, dedicated logic, etc.), software (such as is run on a general purpose computer system or a dedicated machine), firmware, or some combination thereof. In one implementation, method 600A can be performed by a computer system, such as computer system architecture 300 of FIG. 3. In other or similar implementations, one or more operations of method 600A can be performed by one or more other machines not depicted in the figures.

At block 610, processing logic initializes a training set T to an empty set (e.g., { }).

At block 612, processing logic obtains substrate optical property information (e.g., data associated with one or more optical properties of a substrate, such as optical transmission, reflectance, etc.) associated with a substrate(s) handled in a substrate processing system. As described previously, the substrate optical property data may be obtained by an optical property measurement tool (e.g., optical property measuring tool 326 of FIG. 3) or a system for determining substrate optical transmission and/or substrate reflectance (e.g., system 200A, system 200B, or system 200C) as described herein. In some embodiments, processing logic obtains historical substrate optical property data corresponding to substrates previously handled in one or more substrate processing systems. In some embodiments, historical substrate optical property data is uploaded and/or entered (e.g., by a user such as an engineer or technician) to the processing logic from one or more data sheets corresponding to historical substrates.

At block 614, processing logic obtains substrate identification information associated with the substrate(s) above. In some embodiments, the substrate identification information may include information such as substrate type and/or information associated with one or more substrate coatings (e.g., on a top surface or bottom surface of the substrate). In some embodiments, processing logic obtains historical substrate identification information corresponding to historical identifications of substrates (e.g., historical substrate types, historical substrate coatings, etc.). In some embodiments, the historical substrate identification information is uploaded and/or entered to the processing logic from one or more data sheets corresponding to historical substrates.

At block 616, processing logic generates a training input based on the information obtained for the substrate optical properties at block 612. In some embodiments, the training input can include a normalized set of sensor data (e.g., normalized optical transmission data, normalized reflectance data, etc.).

At block 618, processing logic can generate a target output based on the substrate identification information obtained at block 614. The target output can correspond to substrate identification metrics (data indicative of an identified substrate type and/or identified substrate coatings) of a substrate handled in the substrate processing system.

At block 620, processing logic generates an input/output mapping. The input/output mapping refers to the training input that includes or is based on information for the substrate optical properties, and the target output for the training input, where the target output identifies a substrate identification, and where the training input is associated with (or mapped to) the target output. At block 622, processing logic adds the input/output mapping to the training set T.

At block 624, processing logic determines whether the training set, T, includes a sufficient amount of training data to train a machine learning model. It should be noted that in some implementations, the sufficiency of training set T can be determined based simply on the number of input/output mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set, T, includes a sufficient amount of training data to train the machine learning model, processing logic provides the training set, T, to train the machine learning model. Responsive to determining the training set does not include a sufficient amount of training data to train the machine learning model, method 600 returns to block 612.

At block 626, processing logic provides the training set T to train the machine learning model. In some embodiments, the training set T is provided to training engine 382 of server machine 380 (e.g., of FIG. 3) to perform the training. In the case of a neural network, for example, input values of a given input/output mapping (e.g., spectral data and/or chamber data for a previous substrate) are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 626, machine learning model (e.g., machine learning model 390 of FIG. 3) can be used to provide predicted substrate identifications for substrates handled in the substrate processing system.

Figure 6B:
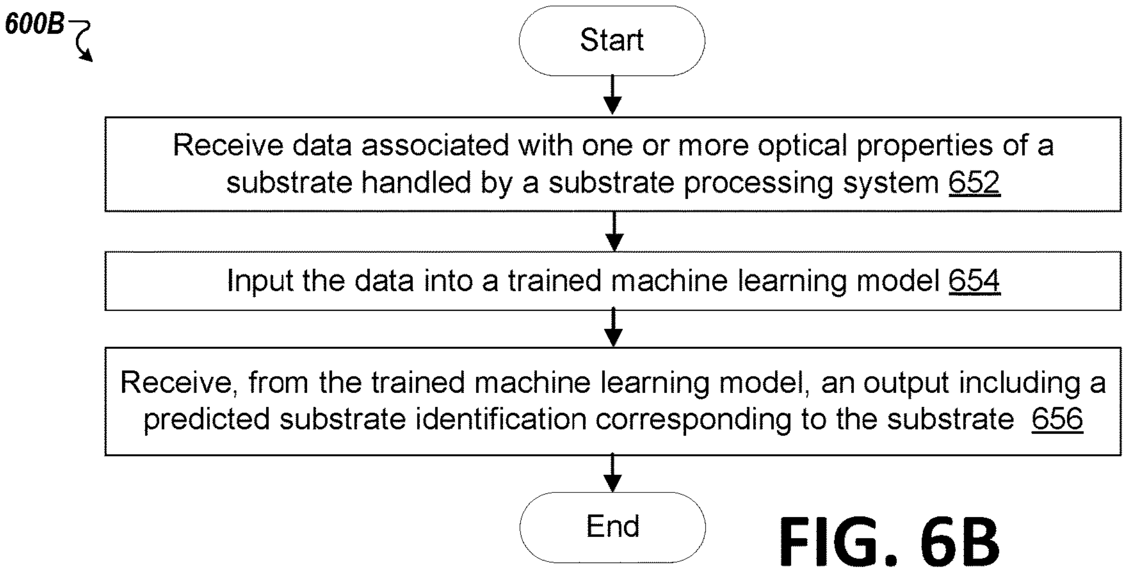
FIG. 6B is a flow chart of a method for generating predicted substrate identification data using a trained machine learning model, according to aspects of the present disclosure.

FIG. 6B is a flow chart of a method 600B for generating predicted substrate identifications using a trained machine learning model, according to aspects of the present disclosure. Method 600B is performed by processing logic that can include hardware (circuitry, dedicated logic, etc.), software (such as is run on a general purpose computer system or a dedicated machine), firmware, or some combination thereof. In one implementation, method 600B can be performed by a computer system, such as computer system architecture 300 of FIG. 3. In other or similar implementations, one or more operations of method 600B can be performed by one or more other machines not depicted in the figures.

At block 652, processing logic receives data associated with one or more optical properties of a substrate (e.g., optical transmission ratio, reflectance, etc.) handled by a substrate processing system. In some embodiments, the data is received from an optical property measurement tool (e.g., optical property measuring tool 326 of FIG. 3) or a system for determining substrate optical transmission (e.g., ratios) and/or substrate reflectance (e.g., system 200A, system 200B, or system 200C) as described herein. The data may be raw sensor data, or may be data that has been processed (e.g., by a processing device, a computing device, etc.) to determine the substrate optical transmission ratio and/or substrate reflectance.

At block 654, processing logic inputs the data received at block 652 into a trained machine learning model. In some embodiments, the trained machine learning model is trained using techniques described herein with reference to FIGS. 3, 5 and/or FIG. 6A. The trained machine learning model may be trained with data input including historical substrate optical property data (e.g., historical optical transmission data, historical reflectance data, etc.). The trained machine learning model may be trained with target output data including historical substrate identification data (e.g., historical corresponding substrate types, historical substrate coatings, etc.). The trained machine learning model may be trained to output one or more predicted substrate identifications based on data input associated with the substrate optical properties. In some embodiments, the trained machine learning model is trained to output data indicating one or more predicted substrate identifications.

At block 656, processing logic receives, from the trained machine learning model, an output including a predicted substrate identification that correspond to the measured substrate. In some embodiments, the predicted substrate identification (e.g., predicted substrate type, predicted substrate coating(s), etc.) may affect the determination of the substrate location (e.g., with respect to the location of a substrate-handling robot end effector handling the substrate). The predicted substrate identification can be used to accurately determine an optical threshold for accurately locating the substrate and/or for performing a corrective action as described herein.

Figure 7:
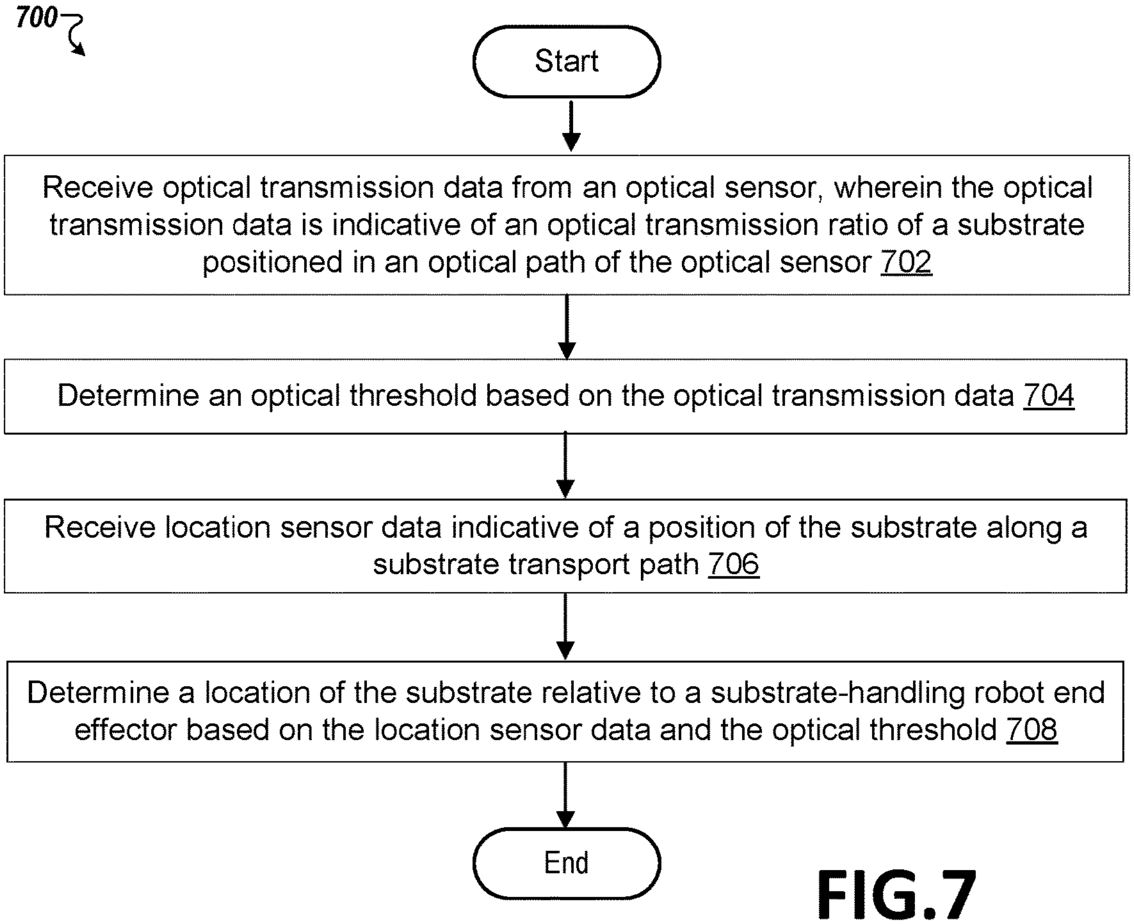
FIG. 7 is a flow chart of a method for determining a substrate location based on a determined optical threshold of the substrate, according to aspects of the present disclosure.

FIG. 7 is a flow chart of a method 700 for determining a substrate location based on a determined optical threshold of the substrate, according to aspects of the present disclosure. Method 700 is performed by a system that can include hardware (circuitry, dedicated logic, optical measuring tools as described herein, etc.), software (such as is run on a general purpose computer system or a dedicated machine), firmware, or some combination thereof. In one implementation, method 700 can be performed by a computer system, such as computer system architecture 300 of FIG. 3 In other or similar implementations, one or more operations of method 700 can be performed by one or more other machines not depicted in the figures.

At block 702, processing logic receives optical transmission data from an optical sensor (e.g., a first optical sensor made up of optical transmitter 230A and optical receiver 230B of FIGS. 2A-2C). In some embodiments, the optical transmission data is indicative of an optical transmission ratio of a substrate positioned in an optical path of the optical sensor. The substrate may be supported in the optical path by a substrate support such as a substrate-handling robot end effector or an aligner stage. In some embodiments, a substrate-handling robot end effector transports the substrate from a first station (such as a substrate carrier) to a second station (such as a load lock) through the optical path of the optical sensor.

At block 704, processing logic determines an optical threshold based on the optical transmission data. In some embodiments, the optical threshold corresponds to an optical transmission ratio of the substrate. For example, the optical transmission ratio may indicate that a certain percentage (e.g., 50%) of light is transmitted through the substrate. The optical threshold may be slightly higher than the optical transmission ratio, in some embodiments. In some examples, the optical threshold is such that a substrate location sensor can detect the presence of the substrate as the substrate passes through a beam of the location sensor. For example, for a substrate with an optical transmission ratio of 0.2 (e.g., corresponding to 20% of light transmitting through the substrate), the optical threshold may be approximately 25%. Thus, when a location sensor detects 25% or less transmitted light intensity, the sensor data may indicate the presence of the substrate.

At block 706, processing logic receives location sensor data indicative of a position of the substrate along a substrate transport path. The processing logic may correlate the time of the location sensor indicating the presence of the substrate (e.g., a location sensor trigger) with a position (e.g., in relation to the time domain) of a substrate-handling robot transporting the substrate along the substrate transport path.

At block 708, processing logic determines a location of the substrate relative to the substrate-handling robot end effector transporting the substrate. The location may be based on the location sensor data and the optical threshold. In some examples, the processing logic can determine an offset of the substrate from the end effector. In some examples, the processing logic determines the distance the center of the substrate is offset relative the center of the robot end effector. The substrate may be offset due to motion of the substrate from accelerations of the end effector.

Figure 8:
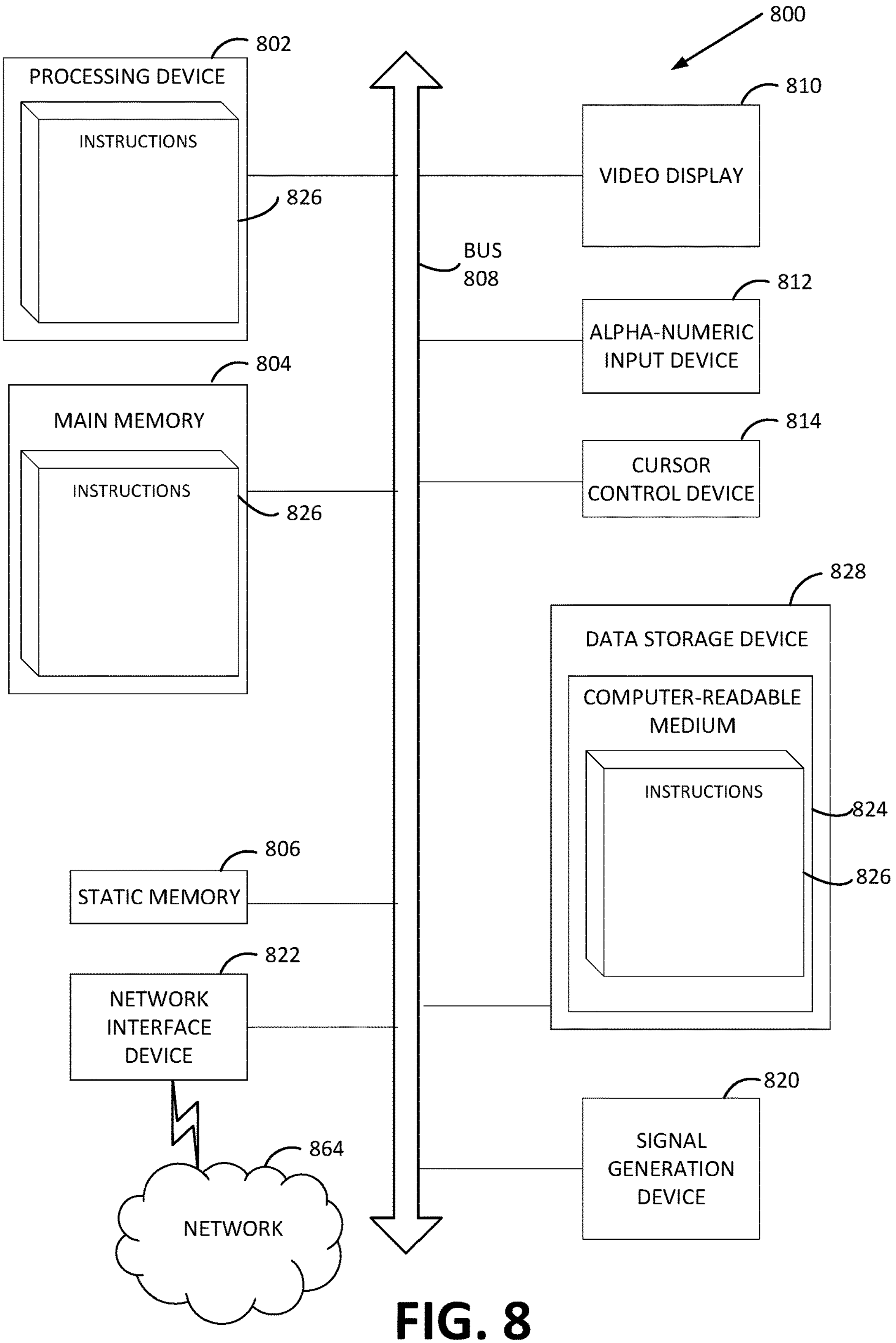
FIG. 8 depicts a diagrammatic representation of a machine in the example form of a computing device within which a set of instructions, for causing the machine to perform any one or more of the methodologies discussed herein, can be executed.

FIG. 8 depicts a diagrammatic representation of a machine in the example form of a computing device 800 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 800 can correspond to one or more of server machine 370, server machine 380, or predictive server 312 as described herein.

The example computing device 800 includes a processing device 802, a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 828), which communicate with each other via a bus 808.

Processing device 802 can represent one or more general-purpose processors such as a microprocessor, central processing unit, or the like. More particularly, the processing device 802 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. Processing device 802 can also be or include a system on a chip (SoC), programmable logic controller (PLC), or other type of processing device. Processing device 802 is configured to execute the processing logic for performing operations discussed herein.

The computing device 800 can further include a network interface device 822 for communicating with a network 864. The computing device 800 also can include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 820 (e.g., a speaker).

The data storage device 828 can include a machine-readable storage medium (or more specifically a non-transitory machine-readable storage medium) 824 on which is stored one or more sets of instructions 826 embodying any one or more of the methodologies or functions described herein. A non-transitory storage medium refers to a storage medium other than a carrier wave. The instructions 826 can also reside, completely or at least partially, within the main memory 804 and/or within the processing device 802 during execution thereof by the computer device 800, the main memory 804 and the processing device 802 also constituting computer-readable storage media.

While the computer-readable storage medium 824 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:

a first optical sensor comprising an emitting element and a receiving element, wherein the first optical sensor is configured to detect an optical transmission ratio of a substrate responsive to the substrate being positioned in an optical path of the first optical sensor;

a processing device communicatively coupled to the first optical sensor, wherein the processing device is configured to:

determine an optical threshold based on the optical transmission ratio of the substrate, wherein the optical threshold is associated with a presence of the substrate at a point of intersection of a transport path and the optical path of the first optical sensor; and determine a location of the substrate relative to a substrate-handling robot end effector during transport of the substrate by the substrate-handling robot end effector along the transport path based on an optical intensity indicated in sensor data output by the first optical sensor exceeding the optical threshold.

2. The system of claim 1, further comprising:

a second optical sensor comprising a second emitting element and a second receiving element, wherein the second optical sensor is configured to detect a first reflectance of a first surface of the substrate, wherein the processing device is further configured to determine a first property of the first surface of the substrate based on the first reflectance.

3. The system of claim 2, further comprising:

a third optical sensor comprising a third emitting element and a third receiving element, wherein the third optical sensor is configured to detect a second reflectance of a second surface of the substrate, wherein the processing device is further configured to determine a second property of the second surface of the substrate based on the second reflectance.

4. The system of claim 3, wherein the first property is associated with a first coating on the first surface of the substrate, and wherein the second property is associated with a second coating on the second surface of the substrate.

5. The system of claim 3, wherein the processing device is further configured to determine a corresponding substrate type based on one or more of the optical transmission ratio, the first reflectance, or the second reflectance.

6. The system of claim 1, wherein the first optical sensor is positioned within a factory interface chamber of a manufacturing system proximate a vacuum port, and wherein the optical path of the first optical sensor at least substantially intersects the transport path of the substrate through the vacuum port.

7. The system of claim 1, wherein the first optical sensor is positioned within a factory interface chamber of a manufacturing system proximate an aligner configured to align the substrate to a target orientation, and wherein the optical transmission ratio is detected responsive to the substrate being placed on the aligner.

8. The system of claim 1, wherein the first optical sensor is coupled to the substrate-handling robot end effector.

9. The system of claim 8, wherein the emitting element is coupled to a first side of a substantially Y-shaped bracket, wherein the receiving element is coupled to a second side of the substantially Y-shaped bracket, and wherein the substantially Y-shaped bracket is configured to move between an extended position and a retracted position responsive to handling of the substrate by the end effector.

10. A non-transitory machine-readable storage medium comprising instructions that, when executed by a processing device, cause the processing device to perform operations comprising:

receiving, by the processing device, data comprising one or more of optical transmission data associated with a substrate from a first optical sensor during transport of the substrate by a substrate-handling robot end effector along a transport path, first reflectance data associated with a first surface of the substrate from a second optical sensor, or second reflectance data associated with a second surface of the substrate from a third optical sensor;

inputting, into a trained machine learning model, one or more of the optical transmission data, the first reflectance data, or the second reflectance data;

receiving, from the trained machine learning model, an output indicating predicted substrate identification data, wherein the predicted substrate identification data corresponds to one or more of a predicted corresponding substrate type, a predicted first property of the substrate, or a predicted second property of the substrate; and determine a location of the substrate relative to the substrate-handling robot end effector during transport of the substrate by the substrate-handling robot end effector along the transport path based on an optical intensity indicated in sensor data output the first optical sensor and exceeding an optical threshold.

11. The non-transitory machine-readable storage medium of claim 10, wherein the trained machine learning model is trained using (i) training input data comprising one or more of historical optical transmission data, historical first reflectance data, or historical second reflectance data, and (ii) target output data comprising historical substrate identification data, wherein the historical substrate identification data corresponds to one or more of historical corresponding substrate types, historical first properties, or historical second properties.

12. The non-transitory machine-readable storage medium of claim 10, wherein receiving the data comprises:

receiving the optical transmission data from a first optical sensor, wherein the optical transmission data is indicative of an optical transmission ratio of the substrate;

receiving the first reflectance data from a second optical sensor configured to detect a first reflectance of the first surface of the substrate; and receiving the second reflectance data from a third optical sensor configured to detect a second reflectance of the second surface of the substrate.

13. The non-transitory machine-readable storage medium of claim 12, wherein the processing device is to perform operations further comprising:

causing a substrate support to position the substrate in an optical path of the first optical sensor;

emitting optical radiation via an emitting element of the first optical sensor; and detecting, via a receiving element of the first optical sensor, an intensity of radiation transmitted along the optical path through the substrate.

* * * * *